(12) United States Patent
Usui et al.

(10) Patent No.: US 8,476,776 B2
(45) Date of Patent: Jul. 2, 2013

(54) SEMICONDUCTOR MODULE, METHOD FOR FABRICATING THE SEMICONDUCTOR MODULE, AND MOBILE APPARATUS

(75) Inventors: Ryosuke Usui, Moriguchi (JP);
Yasunori Inoue, Moriguchi (JP);
Mayumi Nakasato, Moriguchi (JP);
Katsumi Ito, Moriguchi (JP)

(73) Assignee: Sanyo Electric Co., Ltd., Osaka (JP)

( * ) Notice: Subject to any disclaimer, the term of this patent is extended or adjusted under 35 U.S.C. 154(b) by 317 days.

(21) Appl. No.: 12/935,854

(22) PCT Filed: Mar. 18, 2009

(86) PCT No.: PCT/JP2009/055307
§ 371 (c)(1),
(2), (4) Date: Sep. 30, 2010

(87) PCT Pub. No.: WO2009/122911
PCT Pub. Date: Oct. 8, 2009

(65) Prior Publication Data
US 2011/0193222 A1    Aug. 11, 2011

(30) Foreign Application Priority Data

Mar. 31, 2008    (JP) .................................. 2008-091644

(51) Int. Cl.
*H01L 23/28*    (2006.01)
*H01L 23/29*    (2006.01)

(52) U.S. Cl.
USPC ........... 257/790; 257/787; 257/778; 257/780; 257/E23.126

(58) Field of Classification Search
USPC .................. 257/778, 780, 787, 790, E23.126
See application file for complete search history.

(56) References Cited

U.S. PATENT DOCUMENTS 5,834,844 A * 11/1998 Akagawa et al. ............. 257/734
5,990,546 A * 11/1999 Igarashi et al. ............... 257/700

(Continued)

FOREIGN PATENT DOCUMENTS

| JP | 08-306828 | 11/1996 |
|---|---|---|
| JP | 2001-176898 | 6/2001 |
| JP | 2004-349361 | 12/2004 |
| JP | 2007-157879 | 6/2007 |
| JP | 2007-220869 | 8/2007 |
| JP | 2008-053693 | 3/2008 |

OTHER PUBLICATIONS

International Search Report, with English Translation, issued in International Patent Application No. PCT/JP2009/055307, mailed Apr. 28, 2009.

(Continued)

*Primary Examiner* — Nitin Parekh
(74) *Attorney, Agent, or Firm* — McDermott Will & Emery LLP

(57) ABSTRACT

A semiconductor module manufacturing method includes a step of bonding a semiconductor wafer, which has a plurality of semiconductor elements each of which has an element electrode formed thereon, on an expansible first insulating resin layer; a step of dicing the semiconductor wafer; a step of expanding the first insulating resin layer to widen a gap between semiconductor elements; a pressure-bonding step of pressure-bonding a metal plate whereupon an electrode is arranged and the semiconductor elements with the widened gaps in between, by having a second insulating resin layer in between, and electrically connecting the electrode and the element electrodes; a step of forming a wiring layer which corresponds to each semiconductor element by selectively removing the metal plate and forming a plurality of semiconductor modules connected by the first insulating resin layer and the second insulating resin layer; and a step of separating the semiconductor modules by cutting the first insulating resin layer and the second insulating resin layer.

4 Claims, 13 Drawing Sheets

U.S. PATENT DOCUMENTS

| | | | |
|---|---|---|---|
| 6,181,569 B1 * | 1/2001 | Chakravorty | 361/761 |
| 6,791,199 B2 * | 9/2004 | Sakamoto et al. | 257/787 |
| 6,838,748 B2 * | 1/2005 | Ishio et al. | 257/659 |
| 6,998,532 B2 * | 2/2006 | Kawamoto et al. | 174/521 |
| 2005/0093172 A1 * | 5/2005 | Tsukahara et al. | 257/778 |
| 2007/0126030 A1 | 6/2007 | Ito | |
| 2007/0190689 A1 | 8/2007 | Kaneko | |
| 2008/0197482 A1 | 8/2008 | Nagamatsu et al. | |
| 2009/0001604 A1 * | 1/2009 | Tanaka et al. | 257/778 |

OTHER PUBLICATIONS

International Preliminary Examination Report on Patentability, with English Translation, issued in International Application No. PCT/JP2009/055307, mailed on Oct. 14, 2010.

* cited by examiner

100

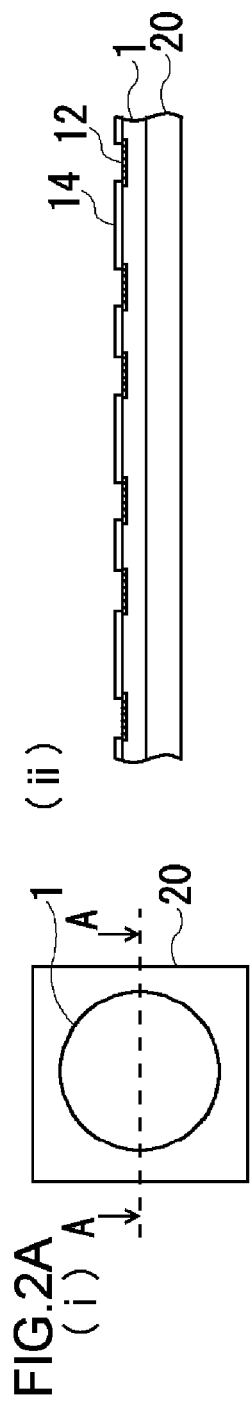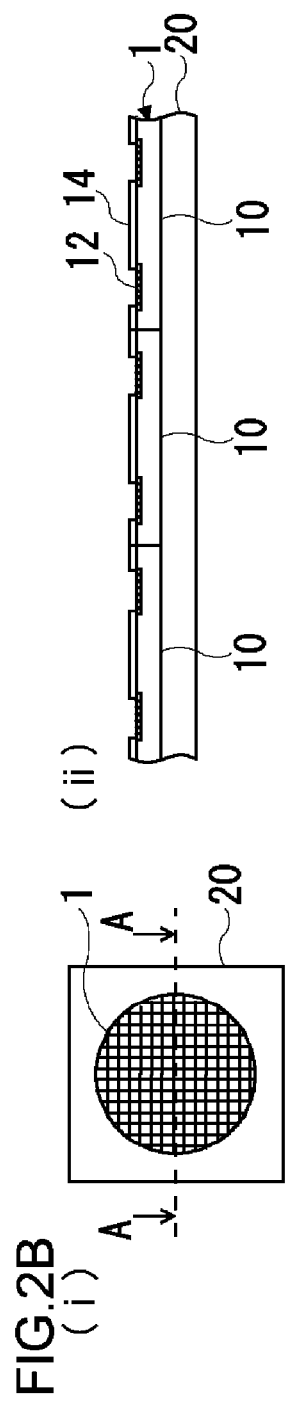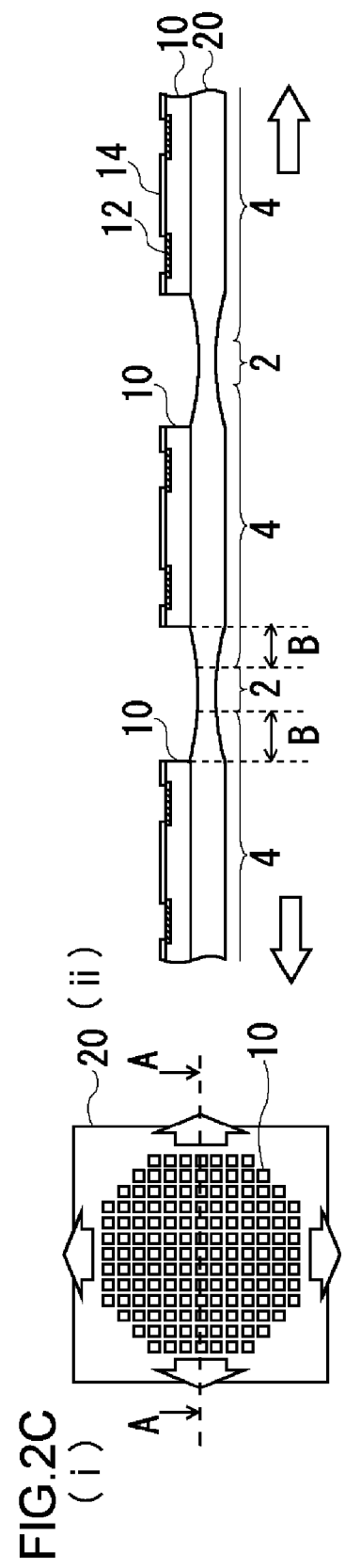

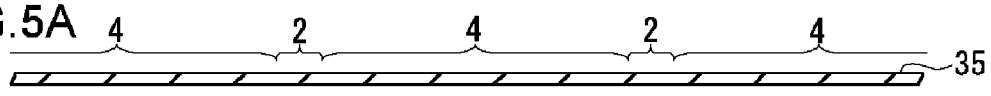
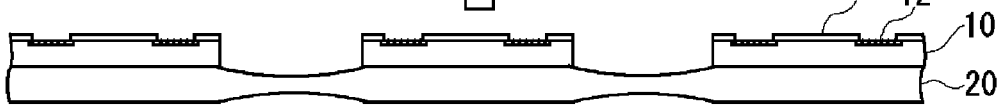
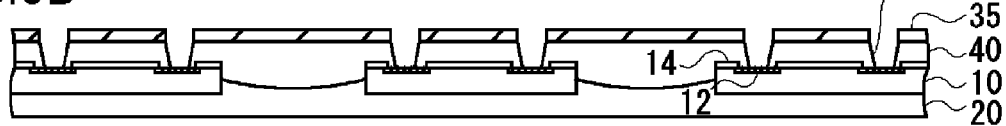
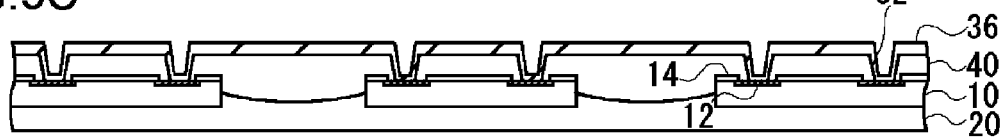
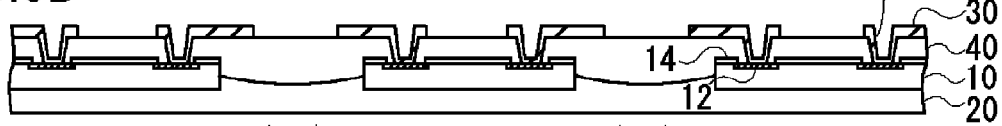
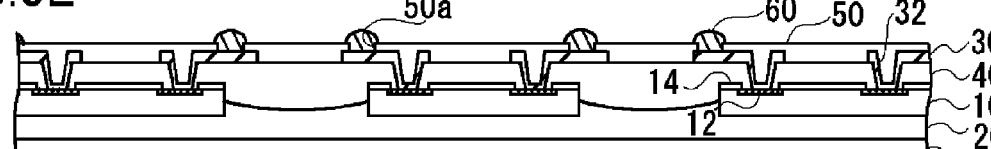
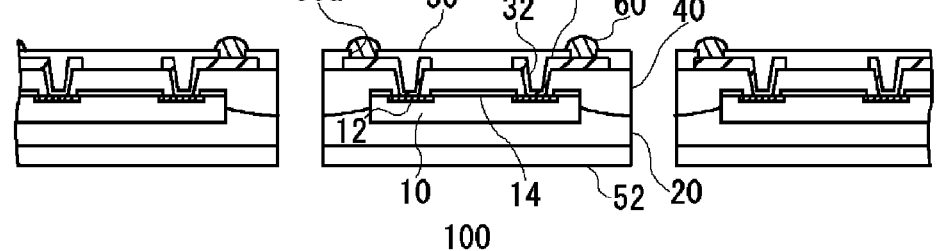

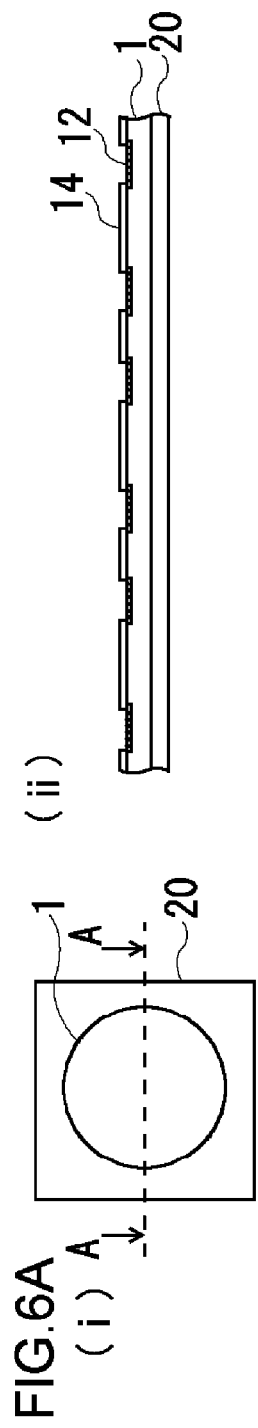
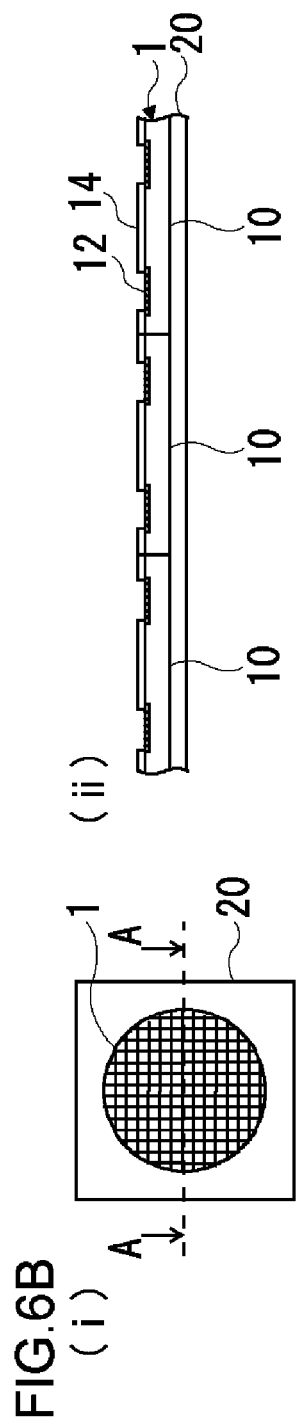
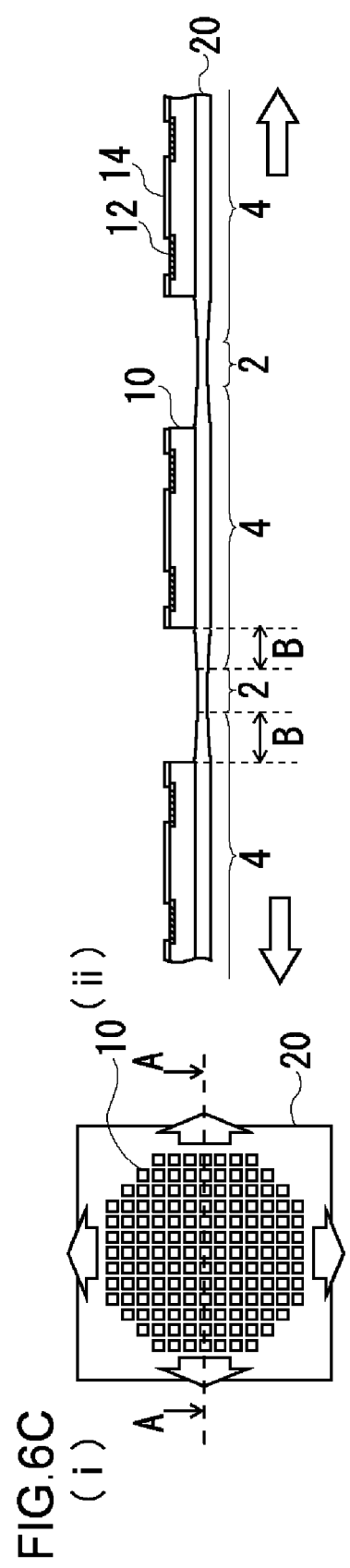

FIG.10A
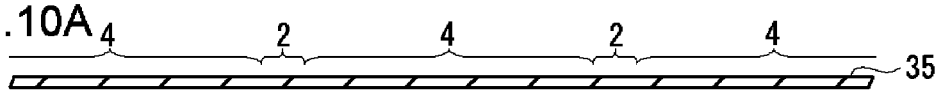
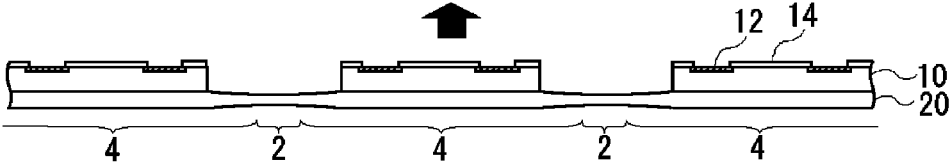
FIG.10B
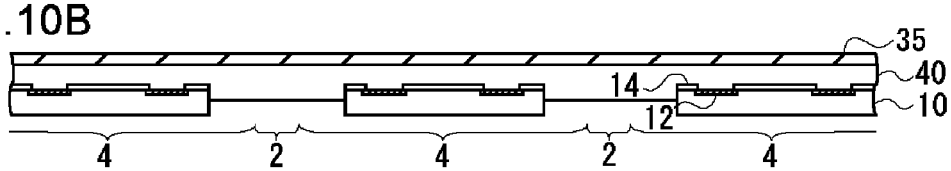
FIG.10C
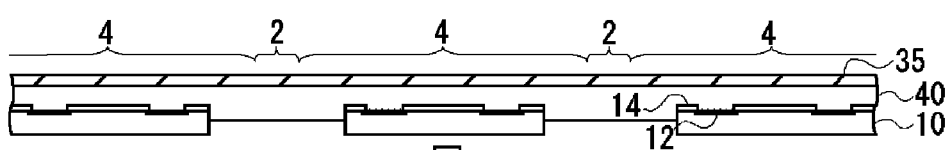
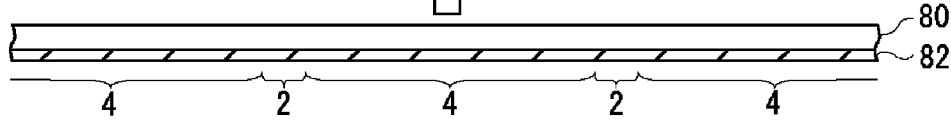
FIG.10D
FIG.10E
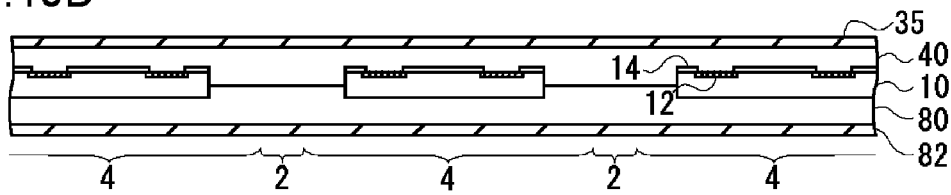

SEMICONDUCTOR MODULE, METHOD FOR FABRICATING THE SEMICONDUCTOR MODULE, AND MOBILE APPARATUS

RELATED APPLICATIONS

This application is the U.S. National Phase under 35 U.S.C. §371 of International Application No. PCT/JP2009/055307, filed on Mar. 18, 2009, which in turn claims the benefit of Japanese Application No. 2008-091644, filed on Mar. 31, 2008, the disclosures of which Applications are incorporated by reference herein.

TECHNICAL FIELD

The present invention relates to a semiconductor module, a method for manufacturing the semiconductor module and a mobile apparatus.

BACKGROUND TECHNOLOGY

Portable electronic devices, such as mobile phones, PDAs, DVCs and DSCs, are gaining increasing sophistication in functions and features. And to be accepted by the market, they have to be smaller in size and lighter in weight, and for the realization thereof, there is a growing demand for highly-integrated system LSIs. On the other hand, these electronic devices are desired to be easier or handier to use, and therefore the LSIs used in those devices are required to be more functionally sophisticated and better performing. For this reason, the higher integration of LSI chips is causing increases in I/O count, which in turn generates demand for smaller packages. To satisfy both these requirements, it is strongly desired that semiconductor packages suited for the high board density packaging of semiconductor components be developed. To meet such needs, a variety of packaging technologies called CSP (Chip Size Package) are being developed.

In CSP, a semiconductor module can be fixed onto a packaging board in a size practically the same as an LSI chip. This helps realize the miniaturization of the packaging board on which CSP is mounted. Thus, the use of CSP enables the electronics equipment and the like to be made smaller in size in its entirety.

A method of manufacturing semiconductor modules of such a CSP type has been proposed as follows (See Patent Document 1) as a method to reduce the number of processes. In other words, this method is such that semiconductor constructions having external connection electrodes are first arranged on a base plate in such a manner as to be mutually apart slightly from each other, and an insulating layer is formed in a periphery-side surface of the semiconductor constructions. Then, the semiconductor constructions and the insulating layer are covered with an insulating film, and a metallic plate having bump electrodes is disposed on the insulating film. Then, the bump electrodes are connected to the external connection electrodes by having the bump electrodes bite into the insulating film. After this, a rewiring is formed by patterning the metallic plate, thereby completing the fabrication of the semiconductor module.

[Patent Document 1] Japanese Unexamined Patent Publication No. 2004-349361.

DISCLOSURE OF THE INVENTION

Problems to be Solved by the Invention

In the conventional method for manufacturing the CSP-type semiconductor modules, a semiconductor wafer on which a plurality of semiconductor devices are formed are diced into pieces with the semiconductor wafer fixed firmly to a dicing tape or the like. Those divided into individual semiconductor devices are separated one by one from the dicing tape with the result that those separated are arranged on the base plate serving as a support in such a manner that they are mutually apart slightly from each other. This is how semiconductor modules are formed. Accordingly, the arrangement of semiconductor devices takes time, thus causing a drop in production efficiency of semiconductor modules.

The present invention has been made based on such realization of the inventors, and a purpose thereof is to provide a technology for improving production efficiency of semiconductor modules in a method for fabricating CSP-type semiconductor modules.

Means for Solving the Problems

In order to resolve the above problems, an embodiment of the present invention relates to a method for fabricating a semiconductor module. The method comprises: bonding a semiconductor substrate onto a first insulating resin layer having an expansibility, the semiconductor substrate having a plurality of semiconductor devices formed therein, each of the semiconductor devices having device electrodes provided on one main surface thereof; dicing the semiconductor substrate into a plurality of individual semiconductor devices; widening spacings between the plurality of semiconductor devices by expanding the first insulating resin layer; pressure-bonding a metallic plate, having bump electrodes opposite to the device electrodes provided on each semiconductor device, to the plurality of semiconductor devices whose spacings are widened on the first insulating resin layer, with a second insulating resin layer interposed therebetween, thereby electrically connecting the bump electrodes to the device electrodes with the bump electrodes penetrating the second insulating resin layer; forming a wiring layer corresponding to respective semiconductor devices by selectively removing the metallic plate, and forming a plurality of semiconductor modules joined with each other by the first insulating resin layer and the second insulating resin layer; and separating the semiconductor modules into individual units by cutting the first insulating resin layer and the second insulating resin layer.

By employing this embodiment, the manufacturing efficiency of semiconductor modules can be enhanced in the manufacturing of CSP type semiconductor modules.

Another embodiment of the present invention relates also to a method for fabricating a semiconductor module. The method comprises: bonding a semiconductor substrate onto a first insulating resin layer having an expansibility, the semiconductor substrate having a plurality of semiconductor devices formed therein, each of the semiconductor devices having device electrodes provided on one main surface thereof; dicing the semiconductor substrate into a plurality of individual semiconductor devices; widening the spacings between the plurality of semiconductor devices by expanding the first insulating resin layer; pressure-bonding the plurality of semiconductor devices whose spacings are widened on the first insulating resin layer to a metallic plate, with a second insulating resin layer interposed therebetween; forming a plurality of via holes by selectively removing the metallic plate and the second insulating resin layer, and forming via electrodes in the via holes such that the via electrodes are electrically connected to the device electrodes; forming a wiring layer corresponding to respective semiconductor devices by selectively removing the metallic plate, and forming a plurality of semiconductor modules joined with each other by the first insulating resin layer and the second insulating resin layer; and separating the semiconductor modules into individual units by cutting the first insulating resin layer and the second insulating resin layer.

Still another embodiment of the present invention relates also to a method for fabricating a semiconductor module. The method comprises: bonding a semiconductor substrate onto a first insulating resin layer having an expansibility, the semiconductor substrate having a plurality of semiconductor devices formed therein, each of the semiconductor devices having device electrodes provided on one main surface thereof; dicing the semiconductor substrate into a plurality of individual semiconductor devices; widening the spacings between the plurality of semiconductor devices by expanding the first insulating resin layer; stacking a second insulating resin layer on top of a metallic plate having bump electrodes opposite to the device electrodes provided on each semiconductor device so as to allow the bump electrodes to penetrate the second insulating resin layer, and pasting the plurality of semiconductor devices, whose spacings are widened on the first insulating resin layer, and the metallic plate together so as to electrically connect the bump electrodes to the device electrodes; removing the first insulating resin layer and pressure-bonding a third insulating resin layer having a metallic layer on one main surface thereof to the semiconductor devices such that the other main surface of the third insulating resin layer is matched against the other main surface of the semiconductor devices; forming a wiring layer corresponding to respective semiconductor devices by selectively removing the metallic plate, and forming a plurality of semiconductor modules joined with each other by the second insulating resin layer and the third insulating resin layer; and separating the semiconductor modules into individual units by cutting the second insulating resin layer and the third insulating resin layer.

Still another embodiment of the present invention relates also to a method for fabricating a semiconductor module. The method comprises: bonding a semiconductor substrate onto a first insulating resin layer having an expansibility, the semiconductor substrate having a plurality of semiconductor devices formed therein, each of the semiconductor devices having device electrodes provided on one main surface thereof; dicing the semiconductor substrate into a plurality of individual semiconductor devices; widening the spacings between the plurality of semiconductor devices by expanding the first insulating resin layer; pasting the plurality of semiconductor devices whose spacings are widened on the first insulating resin layer and a metallic plate together, with a second insulating resin layer interposed therebetween; removing the first insulating resin layer, and pressure-bonding a third insulating resin layer, having a metallic layer on one main surface thereof, to the semiconductor devices such that the other main surface of the third insulating resin layer is matched against the other main surface of the semiconductor devices; forming a plurality of via holes by selectively removing the metallic plate and the second insulating resin layer, and forming via electrodes in the via holes such that the via electrodes are electrically connected to the device electrodes; forming a wiring layer corresponding to respective semiconductor devices by selectively removing the metallic plate, and forming a plurality of semiconductor modules joined with each other by the second insulating resin layer and the third insulating resin layer; and separating the semiconductor modules into individual units by cutting the second insulating resin layer and the third insulating resin layer.

In the above-described embodiment, when the wiring layer is formed, the metallic layer may be selectively removed in accordance with formed regions of the wiring layer. Alternatively, when the wiring layer is formed, the metallic layer may be removed completely.

Still another embodiment of the present invention relates to a semiconductor module. The semiconductor module comprises: a semiconductor device having device electrodes provided on one main surface thereof; a first insulating resin layer disposed on the other main surface of the semiconductor device; a wiring layer having electrodes opposite to the device electrodes; and a second insulating resin layer disposed between the wiring layer and the semiconductor device, wherein the electrodes penetrate the second insulating resin layer so as to electrically connect the electrodes to the device electrodes, wherein the first insulating resin layer and the second insulating resin layer are in contact with each other in areas lateral to the semiconductor device, and the sides of the semiconductor device are covered with the first insulating resin layer and the second insulating resin layer, and wherein the thickness of the first insulating resin layer in areas lateral to the semiconductor device is thinner toward an outer periphery.

In the above-described embodiment, the hardness of the first insulating resin layer in areas lateral to the semiconductor device may be greater than that of the first insulating resin layer on the other main surface of the semiconductor device.

Also, the electrodes may be bump electrodes formed integrally with the wiring layer. Alternatively, the electrodes may be via electrodes.

Still another embodiment of the present invention relates to a portable device. The portable device mounts a semiconductor module according to any one of the above-described embodiments.

The present invention enhances the manufacturing efficiency of semiconductor modules in the manufacturing of CSP type semiconductor modules.

BEST MODE FOR CARRYING OUT THE INVENTION

Hereinafter, the present invention will be described based on preferred embodiments with reference to the accompanying drawings. The same or equivalent constituents, members, or processes illustrated in each drawing will be denoted with the same reference numerals, and the repeated description thereof will be omitted as appropriate. The preferred embodiments do not intend to limit the scope of the invention but exemplify the invention. All of the features and the combinations thereof described in the embodiments are not necessarily essential to the invention.

First Embodiment

FIG. 1 is a schematic cross-sectional view showing a structure of a semiconductor module 100 according to a first embodiment. The semiconductor module 100 includes, as principal components, a semiconductor device 10, a first insulating resin layer 20, a wiring layer 30, a second insulting resin layer 40, a protective layer 50, an insulating layer 52, and an external connection electrode 60.

The semiconductor device 10 has a device electrode 12 on one of main surfaces, namely on a main surface S11 thereof. Also, a device protective layer 14, in which openings are provided so that the device electrode 12 can be exposed from the openings, is stacked on a main surface S11 side. A specific example of the semiconductor device 10 is a semiconductor chip such as an integrated circuit (IC) or a large-scale integrated circuit (LSI). A specific example of the protective layer 14 is a polyimide layer or the like. For example, aluminum (Al) is used as the device electrode 12.

On the main surface S11 side of the semiconductor device 10, the second insulating resin layer 40 is provided between the semiconductor device 10 and the wiring layer (discussed later) 30. The second insulating resin layer 40 is made of an insulating resin and is formed of, for example, a material that develops plastic flow when pressurized. An example of the material that develops plastic flow when pressurized is epoxy-based thermosetting resin. The epoxy-based thermosetting resin to be used for the second insulating resin layer 40 may be, for example, one having viscosity of 1 kPa·s under the conditions of a temperature of 160° C. and a pressure of 8 MPa. If a pressure of 5 to 15 MPa is applied to this epoxy-based thermosetting resin at a temperature of 160° C., then the viscosity of the resin will drop to about ⅛ of the viscosity thereof with no pressurization. In contrast to this, an epoxy resin in B stage prior to thermal hardening has no viscosity, similarly to a case when the resin is not pressurized, under a condition that the temperature is less than or equal to a glass transition temperature Tg. And the epoxy resin also develops no viscosity even when pressurized under the same condition that the temperature is less than or equal to the glass transition temperature Tg.

The wiring layer 30 is disposed on a main surface of the second insulating resin layer 40 opposite to the semiconductor device 10. The wiring layer 30 is formed of a conducive material, preferably of a rolled metal or more preferably of a rolled copper. Or the wiring layer 30 may be formed of electrolyte copper or the like. While electrodes 32 are being electrically connected to the wiring layers 30 and disposed counter to the respective device electrodes 12. The electrode 32 is provided, in a protruding manner, on a second insulating resin layer 40 side of the wiring layer 30. It is preferable that the wiring layer 30 and the electrode 32 be formed integrally with each other. Such a structure prevents the occurrence of cracks or the like due to the heat stress occurring at an interface between the wiring layer 30 and the electrode 32. Also, the connection between the wiring layer 30 and the electrode 32 is assured as compared when they are each a separate item. Moreover, the device electrode 12 and the wiring layer 30 are electrically connected simultaneously when the electrode 32 and the device electrode 12 are press-bonded and therefore another advantageous effect of not increasing the number of processes is achieved.

In an end region of the wiring layer 30 opposite to the electrode 32, a land area which is also used as the wiring, where the external connection electrode 60 (discussed later) is disposed, is formed on a surface of the wiring layer 30 opposite to a side where the electrode 32 is formed. In the present embodiment, the electrode 32 is a bump electrode integrally formed with the wiring layer 30. However, the structure of the electrode 32 is not limited thereto and, for example, the electrode 32 may be a via electrode formed inside a via hole provided in a region corresponding to the electrode 12 in the wiring layer 30 and the second insulating resin layer 40.

The protective layer 50 is provided on a main surface of the wiring layer 30 opposite to the second insulating resin layer 40. This protective layer 50 protects the wiring layer 30 against oxidation or the like. The protective layer 50 may be a solder resist layer, for instance. An opening 50a is formed in a predetermined position of the protective layer 50 corresponding to the land area of the wiring layer 30, and the land area of the wiring layer 30 is partially exposed by the opening 50a. The external connection electrode 60, such as a solder bump, is formed within the opening 50a. And the external connection electrode 60 and the wiring layer 30 are electrically connected to each other. The position in which the external connection electrode 60 is formed, namely, the area in which the opening 50a is formed is, for instance, a targeted position where circuit wiring is extended through a rewiring.

The first insulating resin layer 20 is provided on the other main surface side, namely, on a main surface S12 side of the semiconductor device 10. The first insulating resin layer 20 is made of an insulating resin and is formed of a material, having a predetermined expansibility, such as an epoxy-based thermosetting resin. The hardness of the first insulating resin layer 20 in areas B lateral to the semiconductor device 10 (i.e., the areas B in FIG. 1) is greater than that of the first insulating resin layer 20 in area A on top of the other main surface S12 of the semiconductor device 10. In other words, the hardness of the first insulating resin layer 20 in areas that do not overlap with the semiconductor device 10 in a plan view is greater than that of the first insulating resin layer 20 in an area that overlaps with the semiconductor device 10 in a plan view. For example, the indentation hardness of the first insulating resin layer 20 in the upper area A of the semiconductor device 10 is about 12 N/mm². In contrast thereto, the indentation hardness of the first insulating resin layer 20 in the lateral areas B of the semiconductor device 10 is about 40 N/mm², for instance. The thickness of the first insulating resin layer 20 in the areas lateral to the semiconductor device 10 is thinner toward the outer periphery of the semiconductor module 100.

The insulating layer 52 is provided on a main surface of first insulating resin layer 20 opposite to the semiconductor device 10. This insulating layer 52 is made of the same material as the protective layer 50, and is used to protect the semiconductor module 100 and the like from being warped.

In the semiconductor module 100 according to the present embodiment, the second insulating resin layer 40 is provided between the wiring layer 30 and the semiconductor device 10. The wiring layer 30 is press-bonded to one main surface of the second insulating resin layer 40, whereas the semiconductor device 10 is press-bonded to the other main surface thereof. The electrode 32, which penetrates the second insulating resin layer 40, is electrically connected to the device electrode 12 provided on the semiconductor device 10. A material that develops plastic flow when pressured is used for the second insulating resin layer 40. As a result, when the wiring layer 30, the second insulating resin layer 40 and the semiconductor device 10 are press-bonded in this order and united into one body, the probability that a residual film of second insulating resin layer 40 will stay on at an interface between the electrode 32 and the device electrode 12 is suppressed. Hence, the connection reliability is improved. In a state where the wiring layer 30, the second insulating resin layer 40 and the semiconductor device 10 are press-bonded in this order and united into one body, the first insulating resin layer 20 and the second insulating resin layer 40 are in contact with each other on both sides of the semiconductor device 10. Also, the both side surfaces of the semiconductor device 10 are covered with the first insulating resin layer 20 and the second insulating resin layer 40. That is, the interface between the first insulating resin layer 20 and the second insulating resin layer 40 is in contact with the side surface of the semiconductor device 10.

As described above, the thickness of the first insulating resin layer 20 in the areas B lateral to the semiconductor device 10 is thinner toward the outer periphery of the semiconductor module 100. As a result, a contact area between the first insulating resin layer 20 and the second insulating resin layer 40 increases and therefore the adhesion therebetween improves. Also, since the first insulating layer 20 in the areas B lateral to the semiconductor device 10 is hard, the semiconductor 10 is more reliably fixed due to the anchor effect of the first insulating resin layer 20. Hence, the connection reliability between the device electrode 12 and the electrode 32 is improved.

(Method for Fabricating a Semiconductor Module)

FIGS. 2A to 2C are cross-sectional views showing a process in a method for dicing a semiconductor wafer into a plurality of individual semiconductor devices 10. In each Figure, (i) is a plan view and (ii) is a cross-sectional view taken along the line A-A of (i). In (i) of each Figure, the device electrode 12 shown in (ii) is omitted.

As illustrated in FIG. 2A, prepared first is a semiconductor wafer 1 as a semiconductor substrate where a plurality of semiconductor devices 10 each provided with device electrodes 12 disposed on one main surface S11 thereof are formed and arranged in a matrix shape. More specifically, the semiconductor devices 10, such as predetermined integrated circuits, are formed on the surface of the semiconductor wafer 1, such as a p-type silicon substrate, by a known technique; also, device electrodes 12 are formed in the peripheral or top part of the semiconductor devices 10. The protective layer 14 used to protect the semiconductor device 10 is formed on an area of the surface of the semiconductor device 10 except that of the device electrodes 12. The semiconductor devices 10 are demarcated by a plurality of not-shown scribe lines.

The thus prepared semiconductor wafer 1 is bonded onto a first insulating resin layer 20 having an expansibility. An adhesive is applied to one main surface of the first insulating resin layer 20 on a side where the semiconductor wafer 1 is placed, and the semiconductor wafer 1 is bonded onto the first insulating resin layer 20 by the adhesive power of the adhesive. In the present embodiment, a material having an expansibility, such as epoxy-based thermosetting resin, is used as the first insulating resin layer 20. The thickness of the first insulating resin layer 20 is about 100 µm, for instance.

Then, as illustrated in FIG. 2B, the semiconductor wafer 1 is diced into a plurality of individual semiconductor devices 10. In the dicing of the semiconductor wafer 1, the semiconductor wafer 1 is cut along the scribe lines demarcating the plurality of semiconductor devices 10, by use of a known dicing apparatus. Each semiconductor device 10 is of an approximately square shape with the side length of about 5 mm (approximately quadrangle in shape in a plan view), for instance.

Then, as illustrated in FIG. 2C, the first insulating resin layer 20 is isotropically expanded in an outer circumferential direction so as to widen the spacing between the semiconductor devices 10. The amount of expansion of the first insulating resin layer 20 corresponds to the interval created between every two adjacent semiconductor devices 10. In other words, this interval between every two adjacent semiconductor devices 10 equals, for example, the sum of the width of a scribe line 2, along which the semiconductor modules 100 (described later) are cut into individual units, and two areas B lateral to each semiconductor device 10 in a formed region 4 of each semiconductor module 100. More specifically, the interval is about 2 to 5 mm. The expansion of the first insulating resin layer 20 in the outer circumferential direction is achieved by pulling it in the outer circumferential diction using a known expanding apparatus, for instance. Or the expansion of the first insulating resin layer 20 is achieved by pressing the first insulating resin layer 20 against a so-called expander ring.

FIGS. 3A to 3C are cross-sectional views showing a process in a method for forming electrodes 32. In the present embodiment, an example will be explained where the electrode 32 is a bump electrode. As illustrated in FIG. 3A, a copper sheet 33 is first prepared as a metallic sheet having a thickness greater than at least the sum of the height of the electrode 32 and the thickness of the wiring layer 30.

Then, as illustrated in FIG. 3B, resists 71 are formed selectively in alignment with a pattern of electrodes 32 using a photolithography method. More specifically, a resist film of predetermined film thickness is affixed to the copper sheet 13 by a laminating apparatus, and it is then subjected to exposure by the use of a photo mask having the pattern of electrodes 32. After this, the resists 71 are selectively formed on the copper sheet 33 by a development. To improve the adhesion of the resists 71 to the copper sheet 33, it is desirable that a pretreatment, such as grinding, cleaning and the like, be performed as necessary on the surface of the copper sheet 33 before the lamination of the resist film thereon.

Then, as illustrated in FIG. 3C, the electrodes 32 having a predetermined pattern are formed on the copper sheet 33 using the resists 71 as a mask. More concretely, the electrodes 32 having a predetermined pattern are formed by etching the copper sheet 33 using the resists 71 as a mask. After the formation of the electrodes 32, the resists 71 are removed using a remover. The positions of the electrodes 32 correspond respectively to the positions of the device electrodes 12 of each semiconductor device 10 in the first insulating resin layer 20 where the interval between the semiconductors 10 is widened as a result of expansion of the first insulating resin layer 20.

The electrodes 32 are formed on the copper sheet 33 through a process as described above. The diameter of the base, the diameter of the top, and the height of the electrode 32 according to the present embodiment are about 40 µmϕ, about 30 µmϕ, and about 20 µmϕ, respectively.

FIGS. 4A to 4E are cross-sectional views showing a process in a method for forming the wiring layer 30 and connecting the electrodes 32 to the device electrodes 12. As illustrated in FIG. 4A, a copper sheet 33 is positioned on a main surface side of a second insulating resin layer 40 such that the electrodes 32 face the second insulating resin layer 40. A plurality of semiconductor devices 10 in the state where the intervals are widened on the first insulating resin layer 20 are positioned on the other main surface side of the second insulating resin layer 40. The thickness of the second insulating resin layer 40 is greater than that of the electrode 32, and the thickness of the second insulating resin layer 40 is about 20 µm. Then the copper sheet 33 and the semiconductor devices 10 are press-bonded together with the second insulating resin layer 40 interposed therebetween, using a press machine. The pressure and temperature to be employed in the press-forming are about 5 MPa and about 200° C., respectively.

As the insulating resin layer 40 develops plastic flow in the press-forming, the electrodes 32 penetrate the second insulating resin layer 40. Then, as illustrated in FIG. 4B, the copper sheet 33, the second insulating resin layer 40, the semiconductor devices 10 and the first insulating resin layer 20 are integrated into a single block with the result that the electrodes 32 and the device electrodes 12 are press-bonded and thus electrically coupled with each other. The electrodes 32 penetrate the second insulating resin layer 40 smoothly because the side surfaces of the electrodes 32 are shaped with the diameter being smaller toward the head thereof.

Then, not-shown resists are formed selectively in alignment with a pattern of wiring layers 30 on the main surface of the copper sheet 33, which is on the side opposite to the second insulating resin layer 40, using the photolithography method. Then, as illustrated in FIG. 4C, the wiring layers 30 having a predetermined pattern corresponding to the respective semiconductor devices 10 are formed in the copper sheet 33 by etching the main surface of the copper sheet 33 using the resists as a mask. After that, the resists are removed. The thickness of the wiring layer 30 according to the present embodiment is about 20 μm.

Then, as illustrated in FIG. 4D, a protective layer 50, which has openings 50a in regions corresponding to the positions for the formation of external connection electrodes 60, is formed on the main surface of the wiring layer 30, which is on the side opposite to the second insulating resin layer 40, using the photolithography method. Then the external connection electrodes 60 are formed within the openings 50a. Also, an insulating layer 52 is formed on a main surface of the first insulating layer 20, which is on the side opposite to the semiconductor devices 10.

Then, as illustrated in FIG. 4E, the semiconductor wafer is diced along the scribe lines 2 so as to be cut into a plurality of individual semiconductor modules 100. The semiconductor modules 100 are manufactured through processes as described above.

The following is a summary of advantageous effects of implementing a structure as described above. In the method for fabricating the semiconductor modules 100 according to the present embodiment, the semiconductor wafer 1 is diced and then the first insulating resin layer 20 supporting the semiconductor wafer 1 is expanded. In this state, the thus expanded first insulating resin layer 20 is bonded to the copper plate 33. Thus, the structure and method implemented in the present embodiment eliminates the process in which the semiconductor devices 10 diced into individual ones are separated one by one and then those separated ones are again arranged in such a manner that they are mutually apart at a predetermined interval from each other. As a result, the manufacturing time of semiconductor modules 100 is reduced. Hence, the manufacturing efficiency of semiconductor modules can be enhanced and moreover the manufacturing cost for semiconductor modules can be reduced.

Also, since the intervals or spacings between every two adjacent semiconductor devices 10 are widened by expanding the first insulating resin layer 20, a placement area where the external connection electrode 60 is to be placed in each semiconductor device 10 can be increased. Thus, the total number of external connection electrodes 60 which can be formed in the placement area is increased, so that the demand for the increased number of I/O pins can be met.

Also, in the semiconductor module 100 according to the present embodiment, the thickness of the first insulating resin layer 20 in the areas B lateral to the semiconductor device 10 is thinner toward the outer periphery of the semiconductor module 100. Thus, the contact area between the first insulating resin layer 20 and the second insulating resin layer 40 increases and therefore the adhesion therebetween improves. As a result, the first insulating resin layer 20 and the second insulating resin layer 40 are least likely to break away from each other and therefore the connection reliability between the electrode 32 and the device electrode 12 improves. Also, since the first insulating layer 20 in the areas B lateral to the semiconductor device 10 is hard, the semiconductor 10 is more reliably fixed due to the anchor effect of the first insulating resin layer 20. Hence, the connection reliability between the device electrode 12 and the electrode 32 improves.

Second Embodiment

In the above-described first embodiment, the semiconductor module 100 is formed in such a manner that the copper sheet 33, on which the bump electrodes are formed as the electrodes 32, and the semiconductor device 10 are press-formed with the second insulating resin layer 40 held between the copper sheet 33 and the semiconductor device 10. The semiconductor module 100 may be formed as follows. A description is hereinbelow given of a second embodiment. Note that the same components as those of the first embodiment are given the same reference numerals and the explanation thereof is omitted as appropriate.

FIGS. 5A to 5F are cross-sectional views showing a process in a method, for forming a wiring layer 30 and connecting electrodes 32 to device electrodes 12, according to the second embodiment. As illustrated in FIG. 5A, a copper sheet 35 as a metallic plate and a plurality of semiconductor devices 10 in a state where the intervals are widened on the first insulating resin layer 20 are first press-bonded together with the second insulating resin layer 40 interposed therebetween.

Then, as illustrated in FIG. 5B, part of the copper sheet 35 is removed selectively in alignment with a pattern of electrodes 32 using the photolithography method, for instance. Then, for example, a laser is directed toward removal places on the copper sheet 35; part of the second insulating resin layer 40 is selectively removed until the device electrodes 12 are exposed, thereby forming a plurality of via holes 37. The laser irradiation here may use carbon dioxide laser, for instance.

Then, as illustrated in FIG. 5C, a conductive layer 36 is so formed as to be electrically connected to the device electrodes 12 by plating a metal, such as copper (Cu), by an electrolytic plating method and an electroless plating method or by an electroless plating method. Of the conductive layer 36, a portion formed within the via whole 37, namely a portion thereof corresponding to the via whole 37, constitutes the electrode 32. Note that the interface between the copper sheet 35 and the plated metal is not shown in FIG. 5C. By employing the structure described as above, the conductive layer 36 and the device electrode 12 become conductive to each other with the electrode 32 interposed therebetween.

Then, not-shown resists are formed selectively on a main surface of the conductive layer 36 in alignment with a pattern of wiring layers 30 using the photolithography method. The main surface of the conductive layer 36 is selectively removed using the resists as a mask and, as illustrated in FIG. 5D, the wiring layer 30, having a predetermined pattern, corresponding to each semiconductor device 10 is formed.

Then, as illustrated in FIG. 5E, a protective layer 50 having openings 50a is formed on a main surface of the wiring layer 30 using the photolithography method. Then, external connection electrodes 60 are formed within the openings 50a. Also, an insulating layer 52 is formed on a main surface of the first insulating layer 20, which is on the side opposite to the semiconductor devices 10.

Then, as illustrated in FIG. 5F, the semiconductor wafer is diced along the scribe lines 2 so as to be cut into a plurality of individual semiconductor modules 100. The semiconductor modules 100 are manufactured through processes as described above.

As with the semiconductor module 100 according to the second embodiment described as above, the electrode 32 may be a via electrode. In this case, too, the same advantageous effects as those of the first embodiment can be achieved. Also, in the second embodiment, the electrodes 32 and the device electrodes 12 are not press-bonded, so that the possibility of damaging the device electrodes 12 and the semiconductor 10 can be reduced.

Third Embodiment

A description is hereinbelow given of a third embodiment. Note that the same components as those of the first embodiment are given the same reference numerals and the explanation thereof is omitted as appropriate.

FIGS. 6A to 6C are cross-sectional views showing a process in a method for dicing a semiconductor wafer into a plurality of individual semiconductor devices 10. In each Figure, (i) is a plan view and (ii) is a cross-sectional view taken along the line A-A of (i). In (i) of each Figure, the device electrode 12 shown in (ii) is omitted.

As illustrated in FIG. 6A, prepared first is a semiconductor wafer 1 as a semiconductor substrate where a plurality of semiconductor devices 10 each provided with device electrodes 12 disposed on one main surface S11 thereof are formed and arranged in a matrix shape. The thus prepared semiconductor wafer 1 is bonded onto a first insulating resin layer 20 having an expansibility. In the present embodiment, as will be described later, the first insulating resin layer 20 no longer exists in the semiconductor module 100 in the final form. Thus, the degree of freedom in selecting a material to be used for the first insulating layer 20 is high as compared with the first embodiment and the second embodiment.

Then, as illustrated in FIG. 6B, the semiconductor wafer 1 is diced into a plurality of individual semiconductor devices 10. Then, as illustrated in FIG. 6C, the first insulating resin layer 20 is isotropically expanded in an outer circumferential direction until the spacing (interval) between every two adjacent semiconductor devices 10 equals the sum of the width of a scribe line 2 and two areas B lateral to each semiconductor device 10 in a formed region 4 of each semiconductor module 100.

FIGS. 7A to 7E are cross-sectional views showing a process in a method for forming electrodes 32. In the present embodiment, an example will be explained where the electrode 32 is a bump electrode. As illustrated in FIG. 7A, a copper sheet 33 is first prepared as a metallic sheet having a thickness greater than at least the sum of the height of the electrode 32 and the thickness of the wiring layer 30. Then, as illustrated in FIG. 7B, resists 71 are formed selectively in alignment with a pattern of electrodes 32 using a photolithography method.

Then, as illustrated in FIG. 7C, the bump electrodes 32 as the electrodes 32 having a predetermined pattern are formed on the copper sheet 33 using the resists 71 as a mask. After the formation of the electrodes 32, the resists 71 are removed using a remover. The positions of the electrodes 32 correspond respectively to the positions of the device electrodes 12 of each semiconductor device 10 in the first insulating resin layer 20 where the interval between the semiconductors 10 is widened as a result of expansion of the first insulating resin layer 20.

Then, as illustrated in FIG. 7D, a second insulating resin layer 40 is stacked on a main surface of the copper sheet 33 on the side where the electrodes 32 are formed, in such a manner that the insulating resin layer 40 covers the electrodes 32. Then, as illustrated in FIG. 7E, the heads of the electrodes 32 are exposed by removing a predetermined amount of the second insulating resin layer 40 by performing an asking using O$_2$ plasma or the like on the main surface of the second insulating resin layer 40, thereby allowing the electrodes 32 to penetrate the second insulating resin layer 40. The electrodes 32 are formed and, at the same time, the copper sheet 33 where the second insulating resin layer 40 is laminated on the main surface side on which the electrodes 32 are formed through a process as described above.

FIGS. 8A to 8E and FIGS. 9A and 9B are cross-sectional views showing a process in a method for forming the wiring layer 30 and connecting the electrodes 32 to the device electrodes 12. As illustrated in FIG. 8A, a copper sheet 33, on which the second insulating resin layer 40 is stacked, is first positioned such that the electrodes 32 face the semiconductor devices 10. Then the thus positioned copper sheet 33 is bonded to a plurality of semiconductor devices 10 in the state where the intervals are widened on the first insulating resin layer 20. As a result, the electrodes 32 and the device electrodes 12 are electrically coupled with each other.

Then, as illustrated in FIG. 8B, the first insulating resin layer 20 is removed by separating the first insulating resin layer 20 from the semiconductor device 10. Then, as illustrated in FIG. 8C, the semiconductor devices 10 integrated with the copper sheet 33 are press-bonded to a third insulating resin layer 80 having a copper foil 82, which serves as a metallic layer, the copper foil 82 being disposed on one main surface of the third insulating resin layer 80, by the use of the press machine in such a manner that the other main surface of the third insulating resin layer 80 and the semiconductor devices 10 are pressed together. Similar to the second insulating resin layer 40, the third insulating resin layer 80 is an insulating resin, for instance. And the insulating resin may be an epoxy-based thermosetting resin, for instance. Accordingly, the press-forming causes the third insulating resin layer 80 to develop plastic flow when pressurized and thereby causes the semiconductor devices 10 to submerge into the third insulating resin layer 80. Then the second insulating resin layer 40 and the third insulating resin layer 80 are press-bonded together.

Then, as illustrated in FIG. 8D, the copper sheet 33, the second insulating resin layer 40, the semiconductor devices 10 and the third insulating resin layer 80 are integrally formed into a single block. In this process of forming them integrally, the copper sheet 33 may be warped due to the temperature variation during the press-forming. Nevertheless, the copper foil 82 is provided on the main surface of the third insulating resin 80 opposite to the copper sheet 33 in a state where the copper sheet 33, the second insulating resin layer 40, the semiconductor devices 10 and the third insulating resin layer 80 are united into a single body. As a result, the copper foil 82 is also warped in the opposite direction to the warping of the copper sheet 33. Thus, the occurrence of warping in the copper sheet 33 can be suppressed.

Then, resists of a predetermined pattern are selectively formed on the main surface of the copper sheet 33 by the photolithography method. As illustrated in FIG. 8E, wiring layers 30 of a predetermined pattern corresponding respectively to the semiconductor devices 10 are formed on the copper sheet 33 by etching the main surface of the copper sheet 33 using the resists as a mask. Also, in forming the wiring layers 30, the copper foil 82 is selectively removed in accordance with a pattern of the wiring layers 30. Since the patterning of the foil 82 is performed in alignment with the pattern of wiring layers 30, the warping of wiring layers 30 that may be caused by the temperature variation in a use environment of the semiconductor module 100 can be suppressed. Alternatively, the copper foil 82 may be removed completed.

Then, as illustrated in FIG. 9A, a protective layer 50 having openings 50*a* is formed on a main surface of the wiring layer 30 using the photolithography method. Then, external connection electrodes 60 are formed within the openings 50*a*. Also, an insulating layer 52 is formed on a main surface of the third insulating layer 80, which is on the side opposite to the semiconductor devices 10.

Then, as illustrated in FIG. 9B, the semiconductor wafer is diced along the scribe lines 2 so as to be cut into a plurality of individual semiconductor modules 100. The semiconductor modules 100 are manufactured through processes as described above.

According to the third embodiment, the following advantageous effects are achieved in addition to the aforementioned advantages of the first embodiment. That is, in this third embodiment, the first insulating resin layer 20 does not remain in the semiconductor module 100 which is a final product in the fabrication. Thus, the degree of freedom in selecting a material to be used for the first insulating layer 20 is high, so that the manufacturing cost can be reduced. Also, the semiconductor devices 10 are enclosed inside the insulating resin by the use of the third insulating resin layer 80 on which the copper foil 82 is provided, so that the warping of the copper sheet 33 caused by the temperature variation during a manufacturing process can be prevented.

Also, the copper foil 82 is selectively removed in accordance with a pattern of wiring layers 30 and at the same time it is kept in the semiconductor module 100. This prevents the warping of the wiring layer 30 caused by the temperature variation in a use environment. Thus, the connection reliability between the electrode 32 and the device electrode 12 improves and therefore the reliability of semiconductor modules 100 improves.

Also, in the third embodiment, the copper sheet 33 and the semiconductor devices 10 are bonded together in a state where the electrode 32 is exposed from the second insulating resin layer 40. As a result, the copper sheet 33 and the semiconductor device 10 can be accurately positioned when they are bonded together. Accordingly, the connection reliability between the electrode 32 and the device electrode 12 further improves.

Fourth Embodiment

In the above-described third embodiment, the semiconductor module 100 is formed in such a manner that the second insulating resin layer 40 is laminated and also the copper sheet 33, on which the bump electrodes are formed as the electrodes 32, and the semiconductor devices 10 are pasted together. The semiconductor module 100 may be formed as follows. A description is hereinbelow given of a fourth embodiment. Note that the same components as those of the first and the third embodiment are given the same reference numerals and the explanation thereof is omitted as appropriate.

FIGS. 10A to 10E and FIGS. 11A to 11D are cross-sectional views showing a process in a method, for forming a wiring layer 30 and connecting electrodes 32 to device electrodes 12, according to the fourth embodiment. As illustrated in FIG. 10A, a copper sheet 35 as a metallic plate and a plurality of semiconductor devices 10 in a state where the intervals are widened on the first insulating resin layer 20 are first bonded together with the second insulating resin layer 40 interposed therebetween.

Then, as illustrated in FIG. 10B, the first insulating resin layer 20 is removed by separating the first insulating resin layer 20 from the semiconductor device 10. Then, as illustrated in FIG. 10C, the semiconductor devices 10 integrated with the copper sheet 35 are press-bonded to a third insulating resin layer 80 having a copper foil 82, which serves as a metallic layer, the copper foil 82 being disposed on one main surface of the third insulating resin layer 80, by the use of the press machine in such a manner that the other main surface of the third insulating resin layer 80 and the semiconductor devices 10 are pressed together. Thereby, as illustrated in FIG. 10D, the copper sheet 35, the second insulating resin layer 40, the semiconductor devices 10 and the third insulating resin layer 80 are integrated into a single block.

Then, as illustrated in FIG. 10E, part of the copper sheet 35 is removed selectively in alignment with a pattern of electrodes 32 using the photolithography method, for instance. Then, for example, a laser is directed toward removal places on the copper sheet 35. While the second insulating resin layer 40 is irradiated with the laser, part of the second insulating resin layer 40 is selectively removed until the device electrodes 12 are exposed. This process forms a plurality of via holes 37.

Then, as illustrated in FIG. 11A, a conductive layer 36 is so formed as to be electrically connected to the device electrodes 12 by plating a metal, such as copper (Cu), by an electrolytic plating method and an electroless plating method or by an electroless plating method. Of the conductive layer 36, a portion formed within the via whole 37, namely a portion thereof corresponding to the via whole 37, constitutes the electrode 32. Note that the interface between the copper sheet 35 and the plated metal is not shown in FIG. 11A. By employing the structure described as above, the conductive layer 36 and the device electrode 12 become conductive to each other with the electrode 32 interposed therebetween.

Then, resists are formed selectively on a main surface of the conductive layer 36 in alignment with a pattern of wiring layers 30 using the photolithography method. The main surface of the conductive layer 36 is selectively removed using the resists as a mask and the wiring layer 30 as illustrated in FIG. 11B is formed. Also, the copper foil 82 is selectively removed in alignment with a pattern of wiring layers 30, using the photolithography method.

Then, as illustrated in FIG. 11C, a protective layer 50 having openings 50a is formed on a main surface of the wiring layer 30 using the photolithography method. Then, external connection electrodes 60 are formed within the openings 50a. Also, an insulating layer 52 is formed on a main surface of the first insulating layer 20, which is on the side opposite to the semiconductor devices 10.

Then, as illustrated in FIG. 11D, the semiconductor wafer is diced along the scribe lines 2 so as to be cut into a plurality of individual semiconductor modules 100. The semiconductor modules 100 are manufactured through processes as described above.

As with the semiconductor module 100 according to the fourth embodiment described as above, the electrode 32 may be a via electrode. In this case, too, the same advantageous effects as those of the third embodiment can be achieved except that the positioning efficiency for the electrode 32 relative to the semiconductor device 10 improves because the electrodes 32 are exposed from the second insulating resin layer 40. Also, in the fourth embodiment, the electrodes 32 and the device electrodes 12 are not press-bonded, so that the possibility of damaging the device electrodes 12 and the semiconductor 10 can be reduced.

Fifth Embodiment

Next, a description will be given of a mobile apparatus (portable device) provided with a semiconductor module according to a fifth embodiment. The mobile apparatus presented as an example herein is a mobile phone, but it may be any electronic apparatus, such as a personal digital assistant (PDA), a digital video cameras (DVC) or a digital still camera (DSC).

FIG. 12 illustrates a structure of a mobile phone provided with a semiconductor module 100 according to each of the above-described embodiments of the present invention. A mobile phone 111 has a basic structure of a first casing 112 and a second casing 114 jointed together by a movable part 120. The first casing 112 and the second casing 114 are turnable around the movable part 120 as the axis. The first casing 112 is provided with a display unit 118 for displaying characters, images and other information and a speaker unit 124. The second casing 114 is provided with a control module 122 with operation buttons and a microphone 126. Note that a semiconductor module 100 according to each embodiment of the present invention is mounted within a mobile phone 111 such as this.

FIG. 13 is a partially schematic cross-sectional view (cross-sectional view of the first casing 112) of the mobile phone shown in FIG. 12. A semiconductor module 100 according to any of the preferred embodiments of the present invention is mounted on a printed circuit board 128 via external connection electrodes 60 and is coupled electrically to a display unit 118 and the like by way of the printed circuit board 128. Also, a radiating substrate 116, which may be a metallic substrate or the like, is provided on the back side of the semiconductor module 100 (opposite side of the external connection electrodes 60), so that the heat generated from the semiconductor module 100, for example, can be efficiently released outside the first casing 112 without getting trapped therein.

By employing the semiconductor module 100 according to the embodiments of the present invention, the production efficiency and the manufacturing cost of semiconductor modules 100 are reduced. Thus the manufacturing cost as to a portable device, according to the present embodiment, provided with such a semiconductor module 100 improves. Also, the reliability of mounting the semiconductor module 100 on a printed wiring board improves. Thus the reliability as to a portable device, according to the present embodiment, provided with such a semiconductor module 100 improves.

The present invention has been described by referring to each of the above-described embodiments. However, the present invention is not limited to the above-described embodiments only. It is understood that various modifications such as changes in design may be made based on the knowledge of those skilled in the art, and the embodiments added with such modifications are also within the scope of the present invention.

For example, in the above-described embodiments, the wiring layer of the device mounting board has a single layer. However, this should not be considered as limiting and the wiring layer may be multilayered.

BRIEF DESCRIPTION OF THE DRAWINGS

FIGS. 2A to 2C are cross-sectional views showing a process in a method for dicing a semiconductor wafer into a plurality of individual semiconductor devices 10.

FIGS. 5A to 5F are cross-sectional views showing a process in a method, for forming a wiring layer and connecting electrodes to device electrodes, according to a second embodiment.

FIGS. 6A to 6C are cross-sectional views showing a process in a method, for dicing a semiconductor wafer into a plurality of individual semiconductor devices 10, according to a third embodiment.

FIGS. 10A to 10E are cross-sectional views showing a process in a method, for forming a wiring layer and connecting electrodes to device electrodes, according to a fourth embodiment.

DESCRIPTION OF THE REFERENCE NUMERALS

Figure 1:
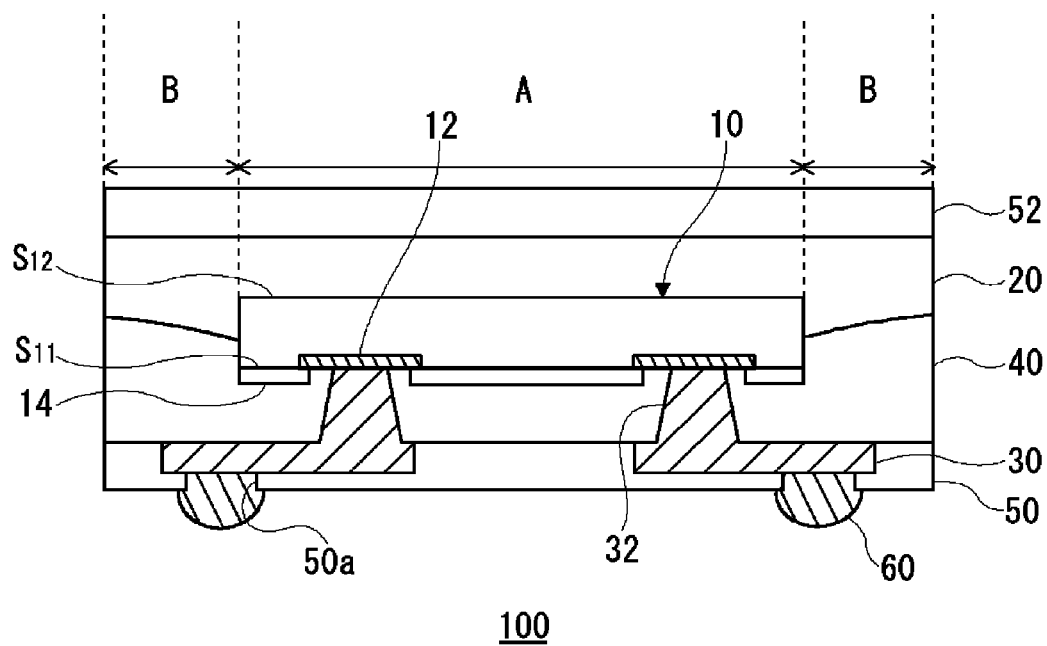
FIG. 1 is a schematic cross-sectional view showing a structure of a semiconductor module according to a first embodiment.
Figure 3A:
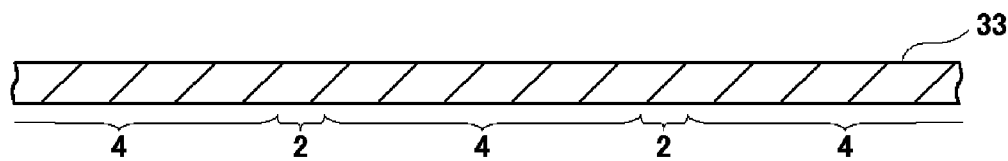
FIGS. 3A to 3C are cross-sectional views showing a process in a method for forming electrodes.
Figure 3B:
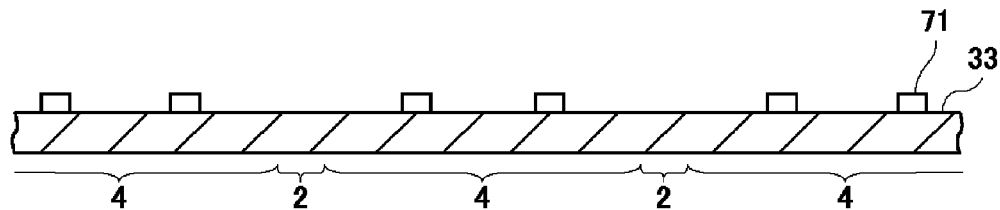
Figure 3C:
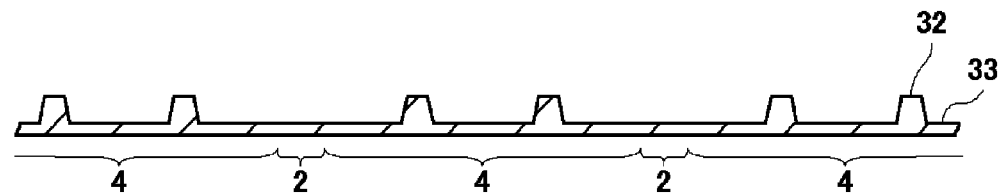
Figure 4A:
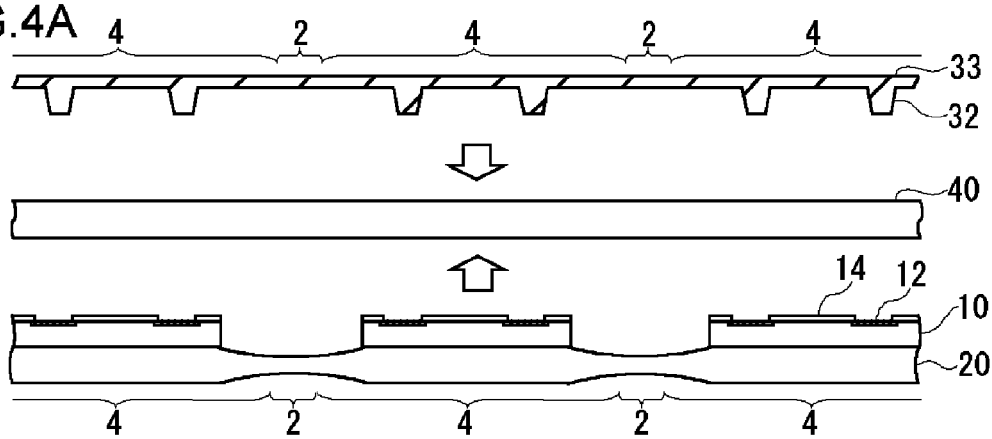
FIGS. 4A to 4E are cross-sectional views showing a process in a method for forming a wiring layer and connecting electrodes to device electrodes.
Figure 4B:
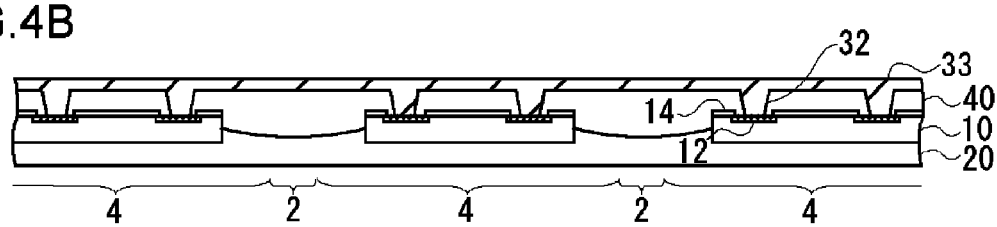
Figure 4C:
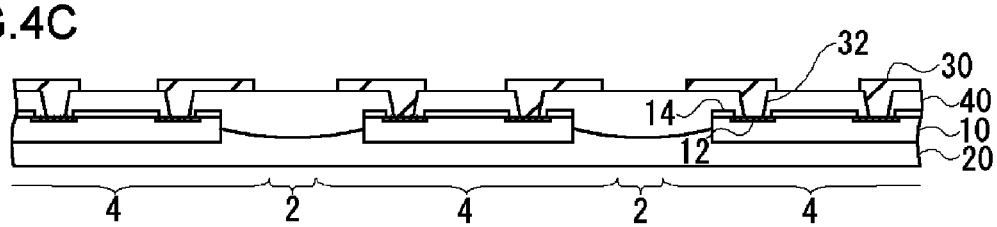
Figure 4D:
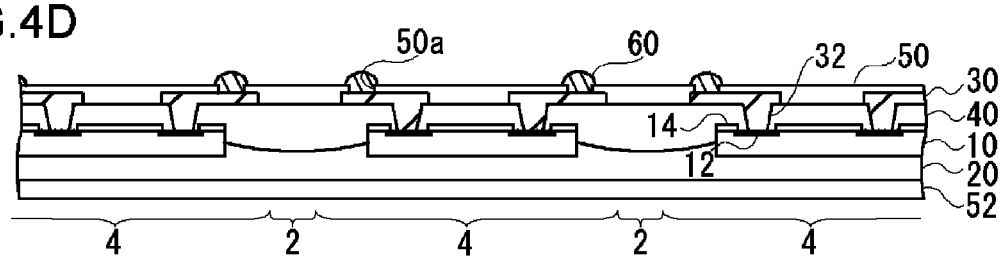
Figure 4E:
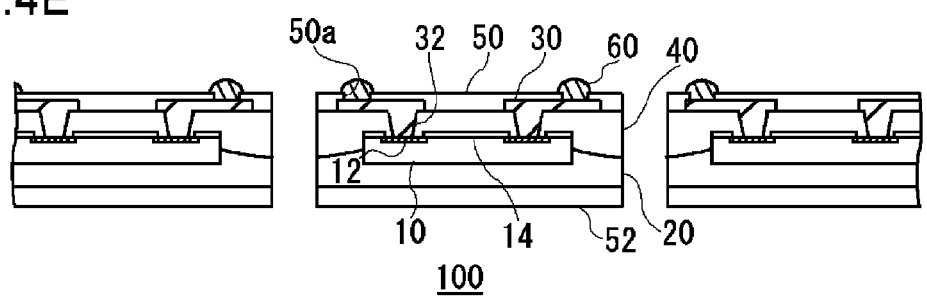
Figure 7A:
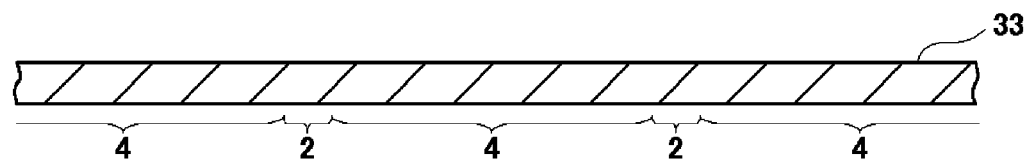
FIGS. 7A to 7E are cross-sectional views showing a process in a method for forming electrodes.
Figure 7B:
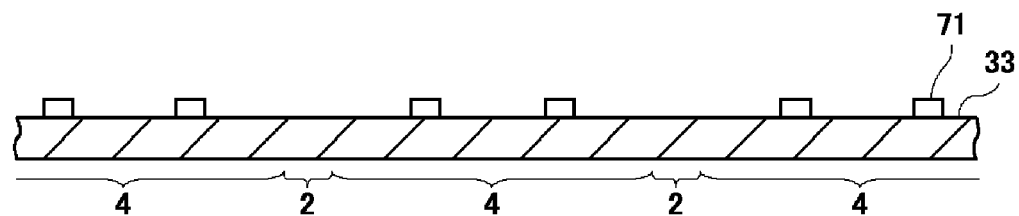
Figure 7C:
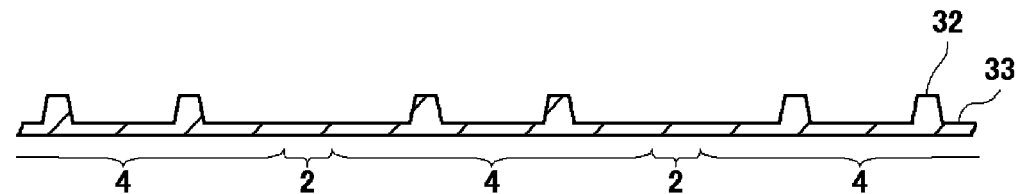
Figure 7D:
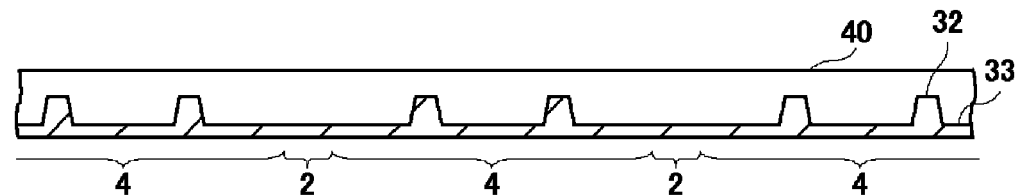
Figure 7E:
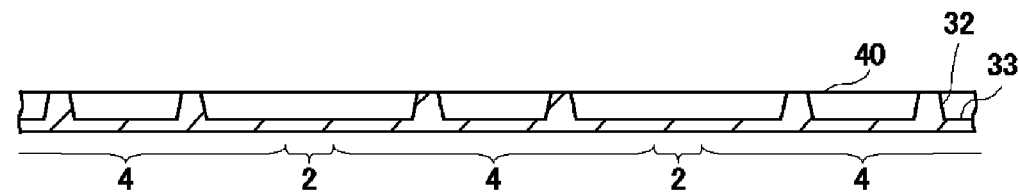
Figure 8A:
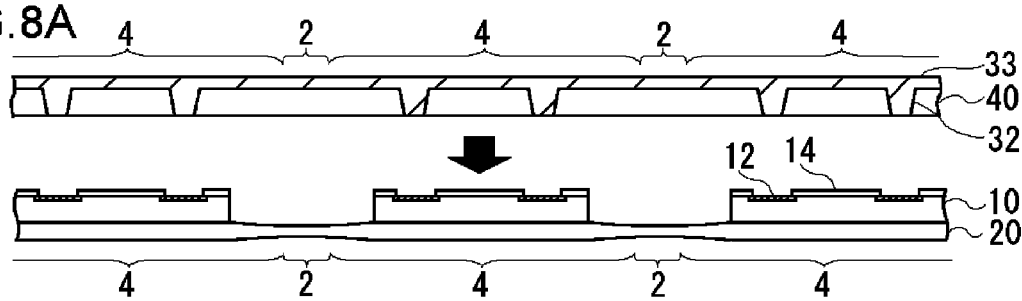
FIGS. 8A to 8E are cross-sectional views showing a process in a method for forming a wiring layer and connecting electrodes to device electrodes.
Figure 8B:
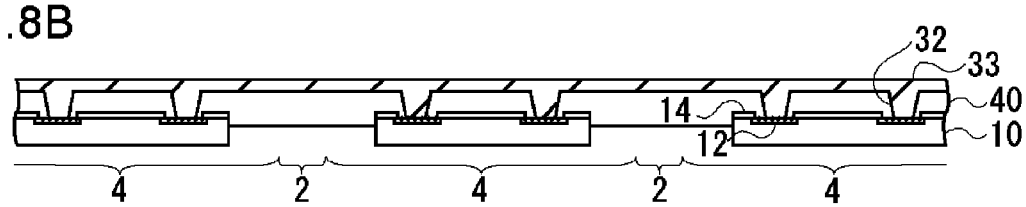
Figure 8C:
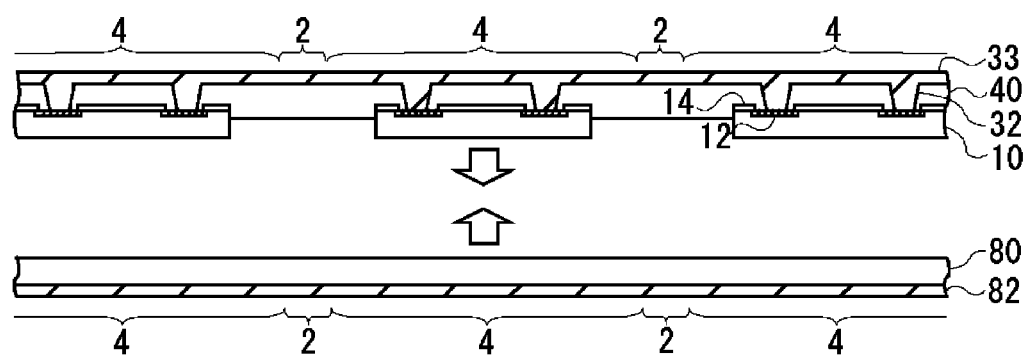
Figure 8D:
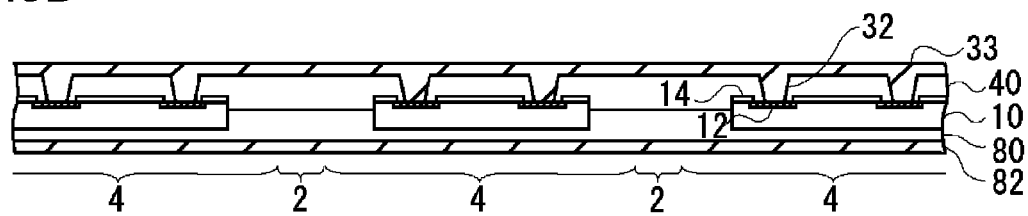
Figure 8E:
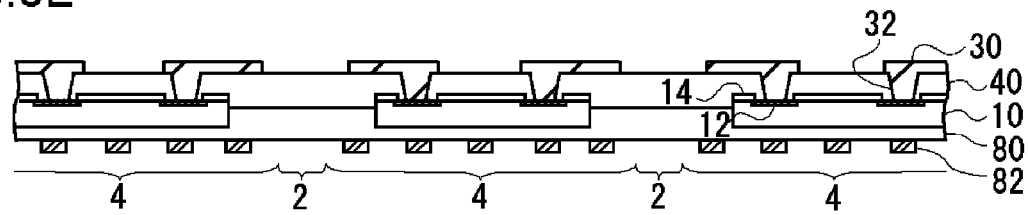
Figure 9A:
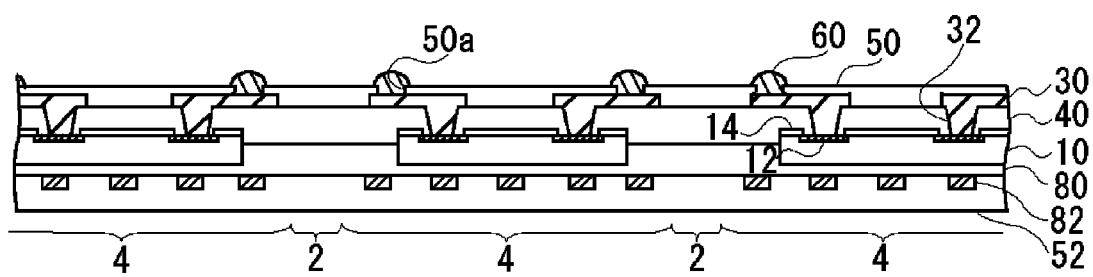
FIGS. 9A and 9B are cross-sectional views showing a process in a method for forming a wiring layer and connecting electrodes to device electrodes.
Figure 9B:
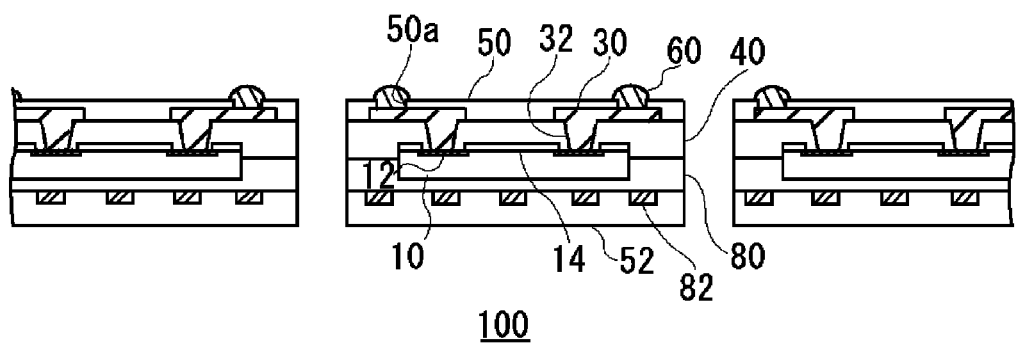
Figure 11A:
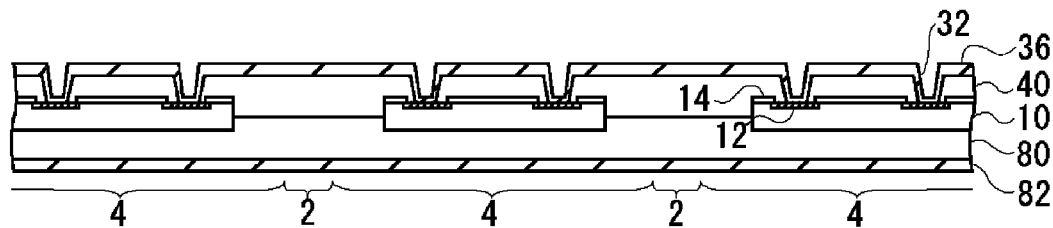
FIGS. 11A to 11D are cross-sectional views showing a process in a method, for forming a wiring layer and connecting electrodes to device electrodes, according to a fourth embodiment.
Figure 11B:
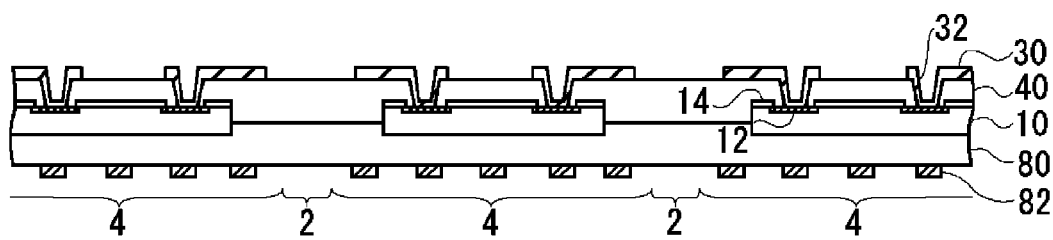
Figure 11C:
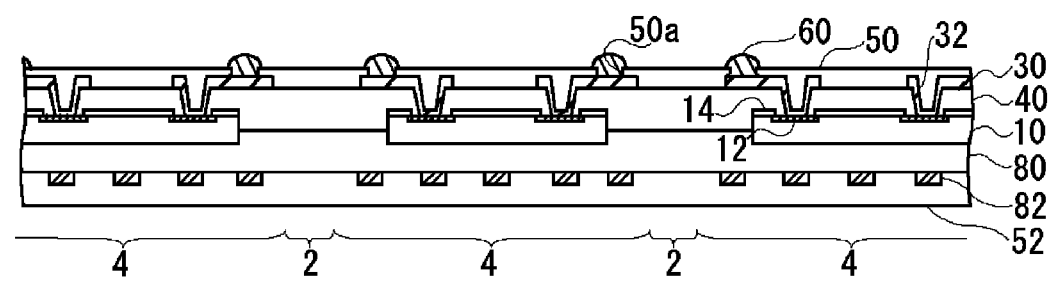
Figure 11D:
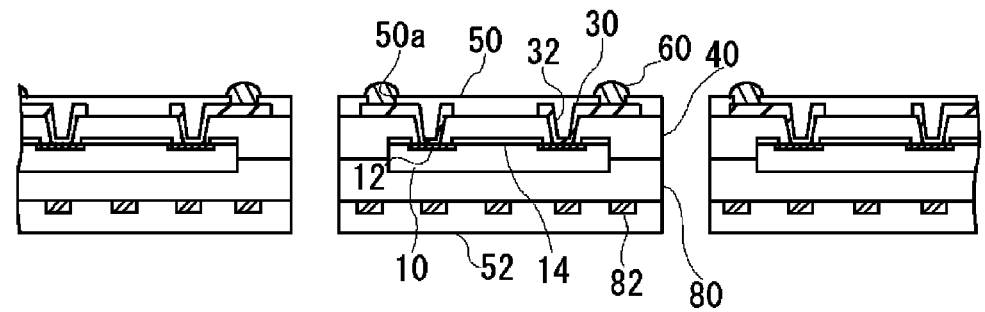
Figure 12:
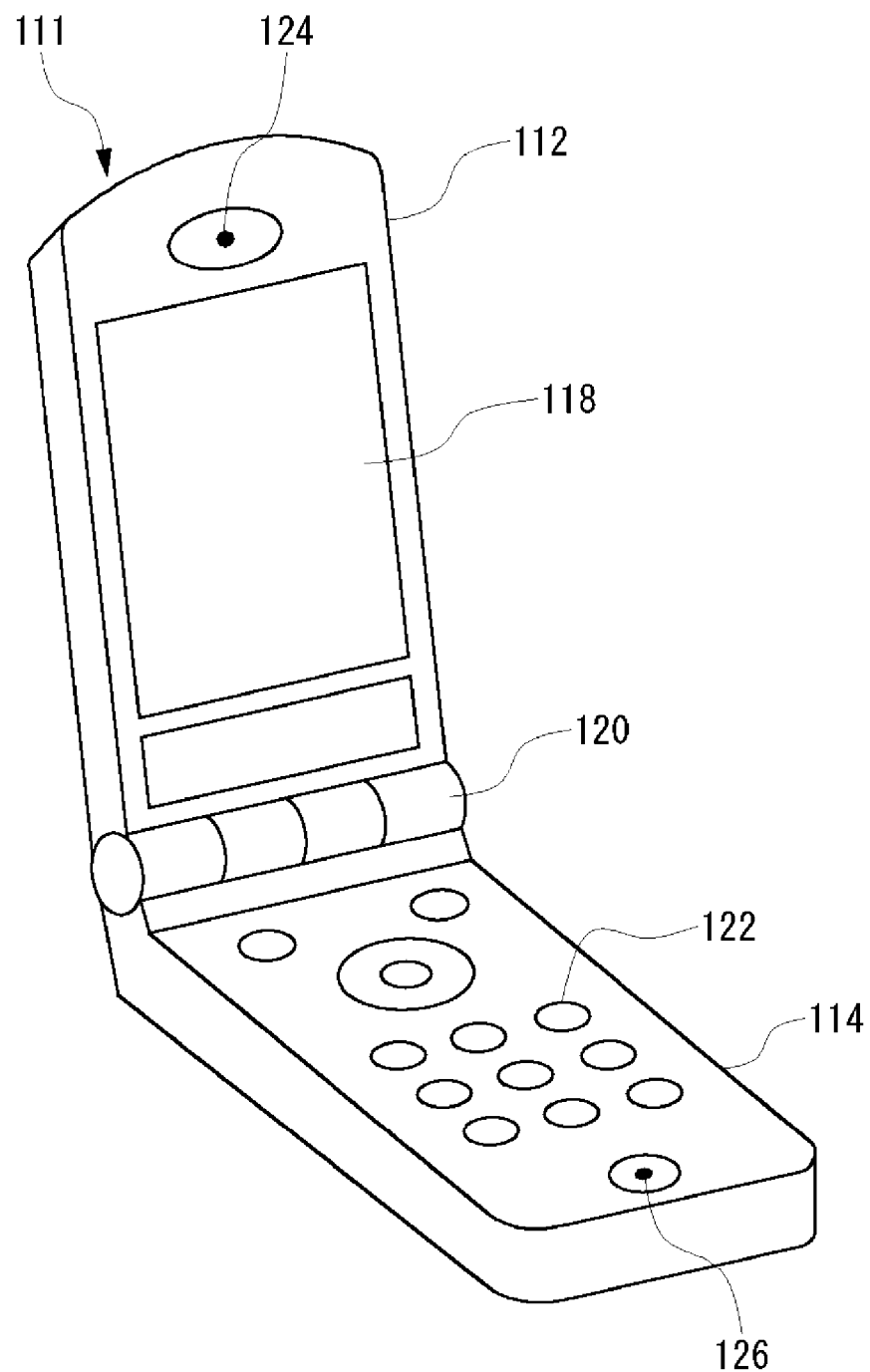
FIG. 12 illustrates a structure of a mobile phone provided with a semiconductor module according to a fifth embodiment.
Figure 13:
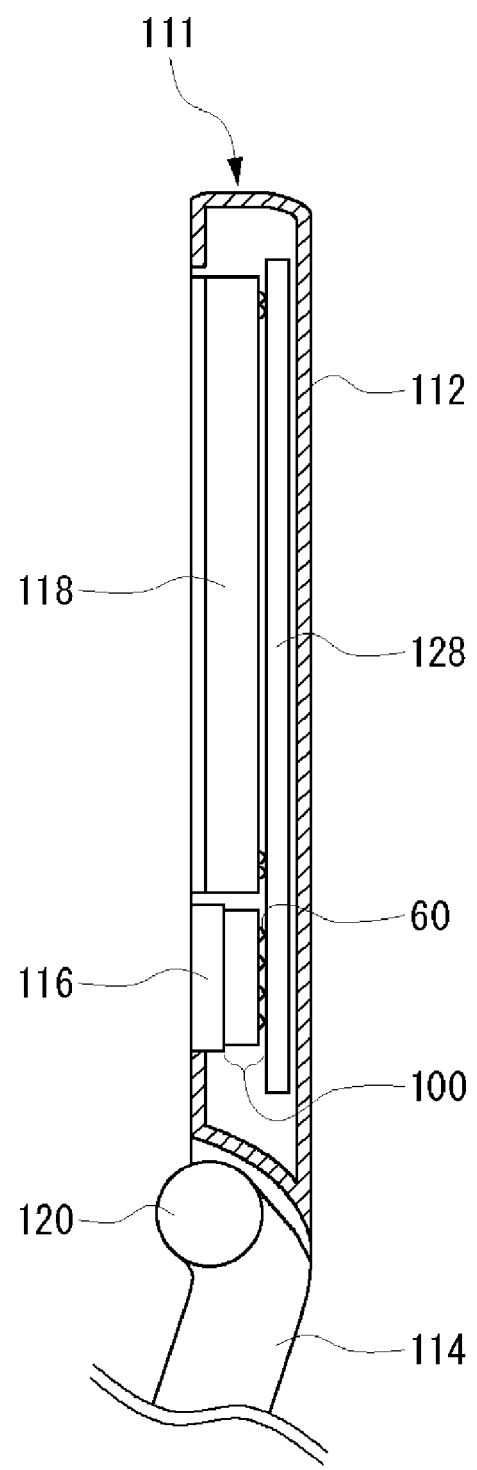
FIG. 13 is a partially schematic cross-sectional view of the mobile phone shown.

1 Semiconductor wafer
2 Scribe line
4 in a formed region 4 of each semiconductor module 100
10 Semiconductor device
12 Device electrode
14 Device protective layer
20 First insulating resin layer
30 Wiring layer
32 Electrode
40 Second insulating resin layer
50 Protective layer
52 Insulating layer
60 External connection electrode
82 Copper foil
80 Third insulating layer
100 Semiconductor module

What is claimed is:
1. A semiconductor module, comprising:
a semiconductor device having device electrodes provided on a first main surface thereof;
a first insulating resin layer disposed on a second main surface, opposite to the first main surface, of said semiconductor device;
a wiring layer having electrodes opposite to the device electrodes; and
a second insulating resin layer disposed between said wiring layer and said semiconductor device,
wherein the electrodes penetrate the second insulating resin layer so as to electrically connect the electrodes to the device electrodes,
wherein said first insulating resin layer and said second insulating resin layer are in contact with each other in areas lateral to said semiconductor device, and the sides of said semiconductor device are covered and being in contact with said first insulating resin layer and said second insulating resin layer, and wherein the first insulating resin layer reduces in thickness along an outer periphery in the lateral direction from the sides of the device toward side edges of the module.

2. A semiconductor module according to claim 1, wherein the hardness of said first insulating resin layer in areas lateral to said semiconductor device is greater than that of said first insulating resin layer on the second main surface of the semiconductor device.

3. A semiconductor module according to claim 1, wherein the electrodes are bump electrodes formed integrally with said wiring layer.

4. A semiconductor module according to claim 1, wherein the electrodes are via electrodes.

* * * * *